United States Patent [19]
Koretsky et al.

[11] Patent Number: 5,562,778
[45] Date of Patent: Oct. 8, 1996

[54] ULTRASONIC JET SEMICONDUCTOR WAFER CLEANING METHOD

[75] Inventors: Ronald G. Koretsky, Poughkeepsie; Donald R. Vigliotti, deceased, late of Yorktown Heights, by Catherine H. Vigliotti, beneficiary; Robert J. von Gutfeld, New York, all of N.Y.

[73] Assignee: International Business Machines Corporation, Armonk, N.Y.

[21] Appl. No.: 335,292

[22] Filed: Nov. 7, 1994

Related U.S. Application Data

[62] Division of Ser. No. 169,872, Dec. 17, 1993, Pat. No. 5,368,054.

[51] Int. Cl.$^6$ .................. B08B 3/12; B08B 7/04; B08B 1/02; C03C 23/00
[52] U.S. Cl. .................. 134/1; 134/2; 134/18; 134/32; 134/33; 134/34
[58] Field of Search .................. 134/2, 1, 18, 32, 134/33, 34

[56] References Cited

U.S. PATENT DOCUMENTS

| | | | |
|---|---|---|---|
| 2,891,176 | 6/1959 | Branson | 310/8.1 |
| 2,987,068 | 6/1961 | Branson | 134/184 |
| 2,992,142 | 7/1961 | Kearney | 134/1 |
| 3,066,686 | 12/1962 | O'Neill | 134/122 |
| 4,138,895 | 2/1979 | Mezrich | 76/626 |
| 4,155,259 | 5/1979 | Engeler | 73/626 |
| 4,168,628 | 9/1979 | Vikomerson | 73/607 |
| 4,326,553 | 4/1982 | Hall | 134/153 |
| 4,403,735 | 9/1983 | Weaver | 239/1 |
| 4,971,920 | 11/1990 | Miyashita et al. | 437/10 |
| 4,980,300 | 12/1990 | Miyashita et al. | 437/10 |

*Primary Examiner*—Jan H. Silbaugh
*Assistant Examiner*—Robin S. Gray
*Attorney, Agent, or Firm*—Michael J. Balconi-Lamica; Susan M. Murray

[57] ABSTRACT

An ultrasonic jet semiconductor wafer cleaning method and apparatus for removing debris from a surface of a semiconductor wafer as the wafer is rotated about a prescribed axis in a cleaning plane whereby a housing having a principal axis, an inlet port, and an outlet port is provided. The method further includes producing focused ultrasonic waves of acoustic energy concentric with and incident the outlet port to form a jet stream of cleaning liquid released through the outlet port; adjustably positioning a focal point of the focused ultrasonic waves between a first focal point position and a second focal point position along an axis; and sweeping the housing in an reciprocating manner along a sweep path.

14 Claims, 6 Drawing Sheets

ULTRASONIC JET SEMICONDUCTOR WAFER CLEANING METHOD

This is a divisional application of application Ser. No. 08/169,872 filed Dec. 17, 1993, now U.S. Pat. No. 5,368,054.

BACKGROUND OF THE INVENTION

1. Field of the Invention

The present invention generally relates to semiconductor wafer cleaning apparatus, and more particularly, to an ultrasonic jet cleaning apparatus for cleaning of semiconductor wafers.

2. Discussion of the Related Art

During the manufacture of semiconductor devices, there are many stages that require cleaning of a silicon wafer or microelectronic parts. A common method for cleaning of silicon wafers or microelectronic parts is to use spin clean systems or tools. These spin clean systems involve the use of a high pressure water jet, on the order of 1200 psi., the high pressure water jet being vertically directed and incident upon a rotating part to be cleaned, the part being positioned therein below. The part is typically disposed in a plane which is at right angles to the incident jet stream. The nozzle of the jet is attached to a reciprocating arm so that the entire part can be accessed. Often, the high pressure of the water column causes damage, particularly when repaired circuits are subjected to the jet stream. A mathematical analysis of the forces exerted by the conventional spin clean tool indicates very large horizontal forces in the region of the boundary layer of the jet at the cleaning plane. These forces are at times strong enough to destroy a repair metallurgy of the repaired circuit since typical circuit lines are vulnerable to shear forces. High pressure water jets are further disadvantageous in that high water pressure greatly increases the buildup of electrostatic charge, which, if sufficiently high, is followed by a discharge. Such discharges, if allowed to occur can destroy circuit elements on a wafer.

Another disadvantage of such high pressure spin clean tools is that they are not economically well suited for a high volume manufacturing environment. That is, such spin clean tools require relatively expensive use of large quantities of ultra-pure deionized (DI) water and the use of high pressure filters necessary to maintain both a high pressure and a purity of the water. Additionally, nozzles of such high pressure spin clean tools are subject to considerable wear under the high water pressures and generally require frequent replacement. Furthermore, additional disadvantages of using such high pressure spin clean tools include relatively high costs associated with both replacement parts and physical labor required for replacement installation, not to mention, problems generated as a result of process down time.

In "Spin-Clean Ultrasonic Jet Cleaner", IBM Technical Disclosure Bulletin, Vol. 34, No. 1, June 1991, pp. 449–450, a modified spin-clean device is disclosed. The modified spin-clean device provides a low pressure water jet operating at pressures on the order of 7.5 psi. A transducer contained within a chamber of the device provides ultrasonic energy which is directed into the water jet near an output nozzle. A disadvantage of such a modified spin-clean device is that the device is not well suited for a variety of cleaning applications. That is, the use of the acoustic energy is not easily optimized for the cleaning of parts having various cleaning requirements. Furthermore, the modified spin-clean device suffers from ill-effects of undue water turbulence within the chamber of the device, whereby optimal transfer of acoustic energy to the workpiece via a liquid jet is not attainable. The modified spin-clean device does not include means for optimizing or measuring an acoustic energy, nor does it provide for control of a cleaning liquid flow pattern.

There is thus needed an apparatus for cleaning semiconductor wafers or microelectronic parts providing a low pressure liquid jet capable of highly efficient energy transfer from an ultrasonic transducer for enhanced cleaning efficiency. Such an apparatus should further be well suited for providing a desired cleaning performance as needed according to the particular requirements of the part being cleaned. Still further, such an apparatus should be well suited for use in a high volume manufacturing environment.

SUMMARY OF THE INVENTION

An object of the present invention is to provide a spin-clean apparatus which overcomes the above-mentioned problems and disadvantages.

Another object of the present invention is to provide an optimal low pressure liquid jet produced by a highly efficient transfer of focused ultrasonic waves of acoustic energy into the liquid jet and more particularly, onto the surface of the workpiece.

According to the invention, a semiconductor wafer cleaning apparatus, for removing debris from a surface of a semiconductor wafer as the wafer is rotated about a prescribed axis in a cleaning plane, comprises a housing, a focused ultrasonic wave producing means, a focal point positioning means, and a sweeping means. The housing has a principal axis, an inlet port for receiving a cleaning liquid from a supply, and an outlet port concentric about the principal axis for releasing the cleaning liquid therethrough. The focused ultrasonic wave producing means is located within the housing along the principal axis thereof for producing ultrasonic waves of acoustic energy focused to a focal point wherein acoustic energy density is maximum at the focal point. The focused ultrasonic waves of acoustic energy are concentric with and incident the outlet port to form a jet stream of cleaning liquid released through the outlet port, wherein the jet stream of cleaning liquid is characterized by longitudinal forces and non-cavitation of the cleaning liquid. The focal point positioning means adjustably positions the focal point of the focused ultrasonic wave producing means between a first focal point position and a second focal point position along the principal axis of the housing. Lastly, a sweeping means coupled to the housing sweeps the housing in a reciprocating manner along a prescribed sweep path over the cleaning plane, wherein the outlet port is positioned in a direction of the cleaning plane and the principal axis is substantially perpendicular to the cleaning plane.

BRIEF DESCRIPTION OF THE DRAWINGS

The foregoing and other teachings of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF THE PREFERRED EMBODIMENTS

Figure 1:
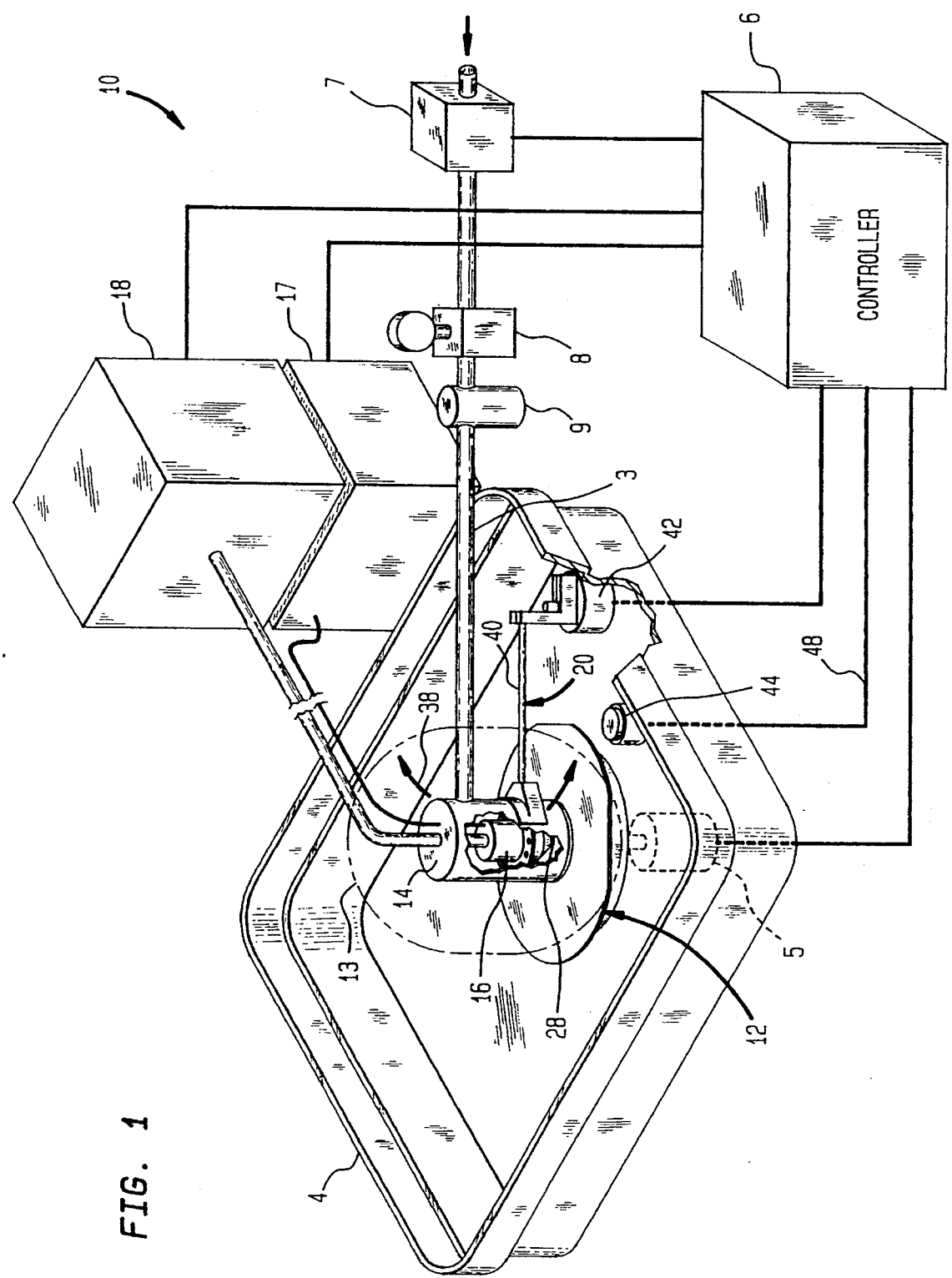
FIG. 1 is a schematic view, with parts in section of a semiconductor wafer cleaning apparatus according to the present invention.
Figure 2:
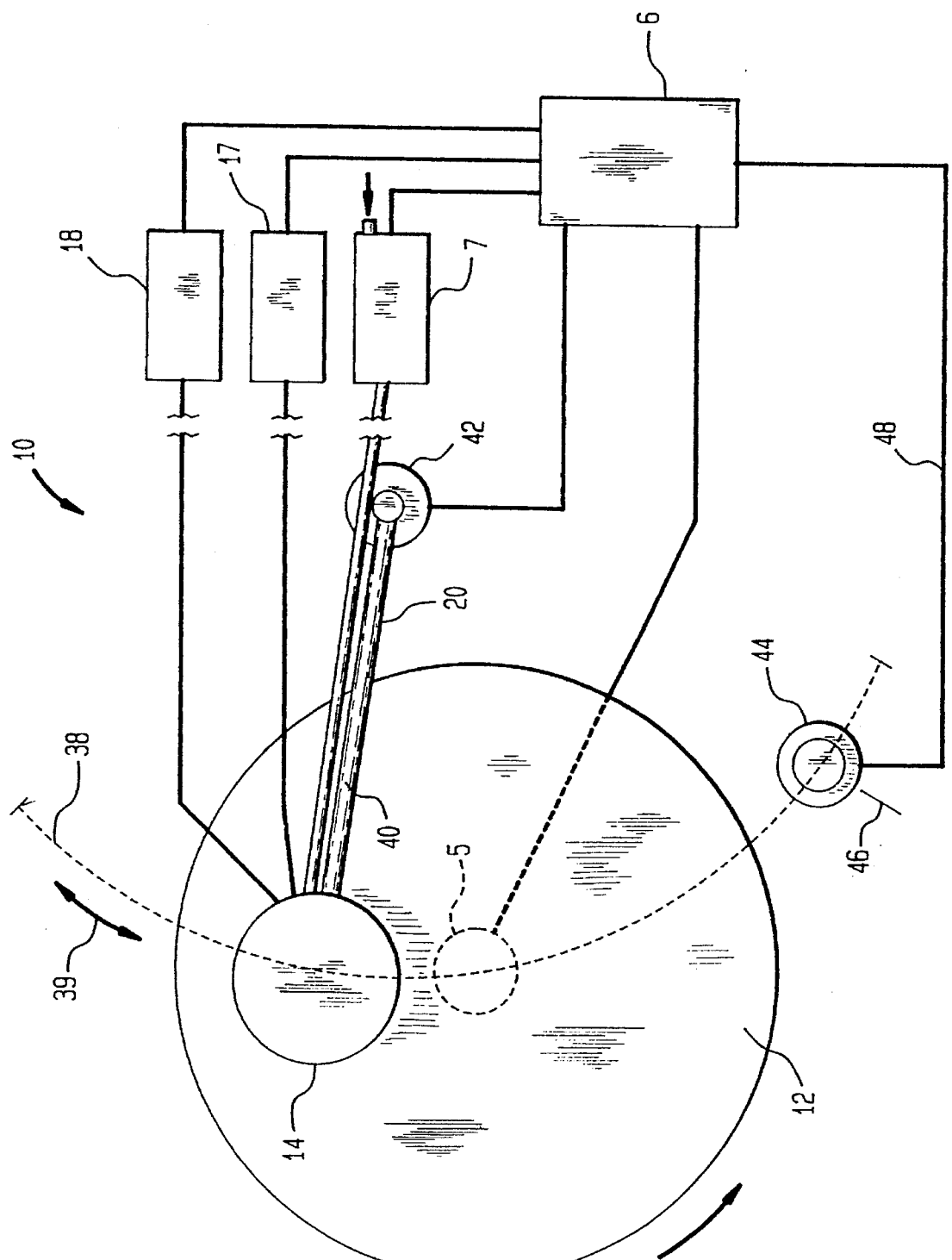
FIG. 2 is a top schematic view of the apparatus according to the present invention.

Referring now to FIGS. 1 and 2, a cleaning apparatus 10 according to the present invention shall be described. Cleaning apparatus 10 shall be described with reference to the cleaning or removing of debris from a surface on a semiconductor wafer or workpiece 12 as the wafer is rotated about a prescribed axis in a cleaning plane (indicated by numeral 11 in FIG. 3). Wafer 12 is securably held in the cleaning plane on a rotatable platen or the like, as is well known in the art, wafer 12 further being positioned within a basin 4. A motor 5 provides rotational motion to wafer 12 as controlled by a controller 6. Controller 6 may comprise a suitable control means such as a computer controller or the like, programmed for the desired operation of motor 5. Programming of a computer controller is well known in the art and therefore not discussed in detail herein. While the discussion to follow makes reference to the cleaning of a wafer 12, it should be noted that cleaning apparatus 10 may be suitable for cleaning of other similar objects, such as magnetic disks for example. Cleaning apparatus 10 includes a liquid jet cell 13 and comprises a housing 14, a focused ultrasonic wave producing means 16, a focal point positioning means 18, and a sweeping means 20.

Cleaning liquid from a supply (not shown) can typically be fed into liquid jet cell 13 via a valve 7, a pressure regulator 8, and a filter 9. Valve 7 can comprise any suitable electronically controllable valve, electrically connected to controller 6 for control thereof. Regulator 8 comprises any suitable regulator for regulating the pressure of the cleaning liquid to be in a low pressure range of approximately 1 to 25 psi. Filter 9 can comprise any suitable known filter for filtering the cleaning liquid therethrough. A flexible tubing 3 connects between filter 9 and housing 14 of liquid jet cell 13.

Figure 3:
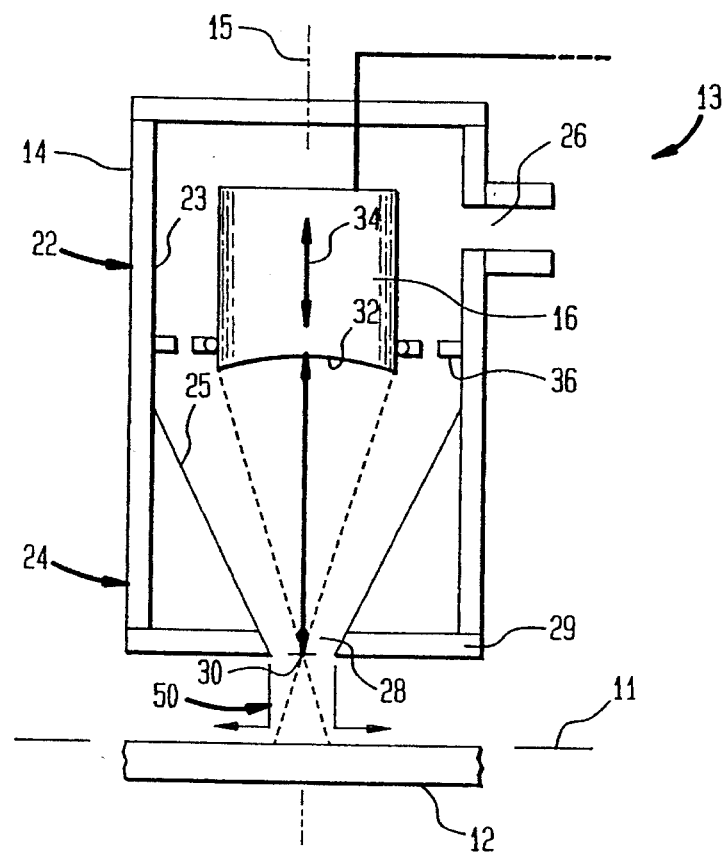
FIG. 3 shows a schematic view with parts in section of an ultrasonic jet cell in a first condition according to the present invention.

Referring now to FIG. 3, housing 14 of liquid jet cell 13 comprises a chamber having a principal axis 15 and is further characterized by first and second portions, 22 and 24, respectively. Housing 14 may be constructed out of any suitable material, for example, metal, for providing at a minimum the desired features described hereinafter. First portion 22 constitutes an upper portion of housing 14 and includes an inlet port 26 for receiving a cleaning liquid via flexible tubing 3 from a supply (not shown). Inlet port 26 is preferably positioned on portion 22 so as to minimize any turbulent flow of a cleaning liquid as the cleaning liquid is introduced into housing 14 during operation and use.

Second portion 24 constitutes a lower portion of housing 14 and includes an outlet port 28 for releasing cleaning liquid therethrough. Second portion 24 is characterized by an inner wall 25 having a tapered shape in the form of an inverted cone. More particularly, the inner wall 25 of portion 24 substantially matches an inner wall 23 of portion 22 at a boundary therebetween, and inner wall 25 is thereafter tapered down to a dimension substantially matched to the size of the outlet port 28. The conically tapered shape of the inner wall 25 of portion 24 assists in the reduction of turbulent flow of liquid within housing 14 to a minimum.

Outlet port 28 is preferably concentric about the principal axis 15. Outlet port 28 comprises a nozzle having a cross-sectional diameter on the order of between 0.5 and 1.0 mm (i.e., 500 to 1,000 microns). Outlet port 28 is a suitable nozzle for promoting laminar flow, such as is well known in the art. Outlet port 28 preferably comprises a conically shaped tapered machined orifice in a metal plate 29, as shown in FIG. 3. The orifice further comprises a highly polished smooth surface.

Focused ultrasonic wave producing means 16 is located within said housing 14 along the principal axis 15 thereof. Focused ultrasonic wave producing means 16 produces ultrasonic waves of acoustic energy focused to a focal point 30 wherein an acoustic energy density is maximum at the focal point 30. Preferably, focused ultrasonic wave producing means 16 comprises an ultrasonic transducer having a concave surface 32 for providing focused ultrasonic waves of acoustic energy with an acoustic focal length of 1.6 cm and capable of an acoustic power density of 5,000 Watts per square centimeter (W/cm$^2$). Transducer 16 may comprise a suitable transducer such as is commercially available from Precision Acoustic Devices, Inc. of Fremont, Calif. Focused ultrasonic wave producing means 16 should be operable at a frequency within the range of 0.1 MHz to 100 MHz.

Focused ultrasonic wave producing means 16 is energized by a suitable radio frequency (RF) generator 17, generator 17 being electrically connected to means 16. RF generator 17 is preferably controlled by controller 6 for providing a desired RF signal Output to means 16. That is, RF generator 17 is controlled by controller 6 for enabling focused wave generating means 16 to be operable at a frequency within the range of 0.1 MHz to 100 MHz.

Focused ultrasonic wave producing means 16 is suitably positioned within housing 14, as will be discussed in further detail herein below, such that the focused ultrasonic waves of acoustic energy produced thereby are concentric with and incident about the outlet port 28. That is, the concave surface of transducer 16 for producing focused ultrasonic waves is oriented within housing 14 towards outlet port 28.

Figure 4:
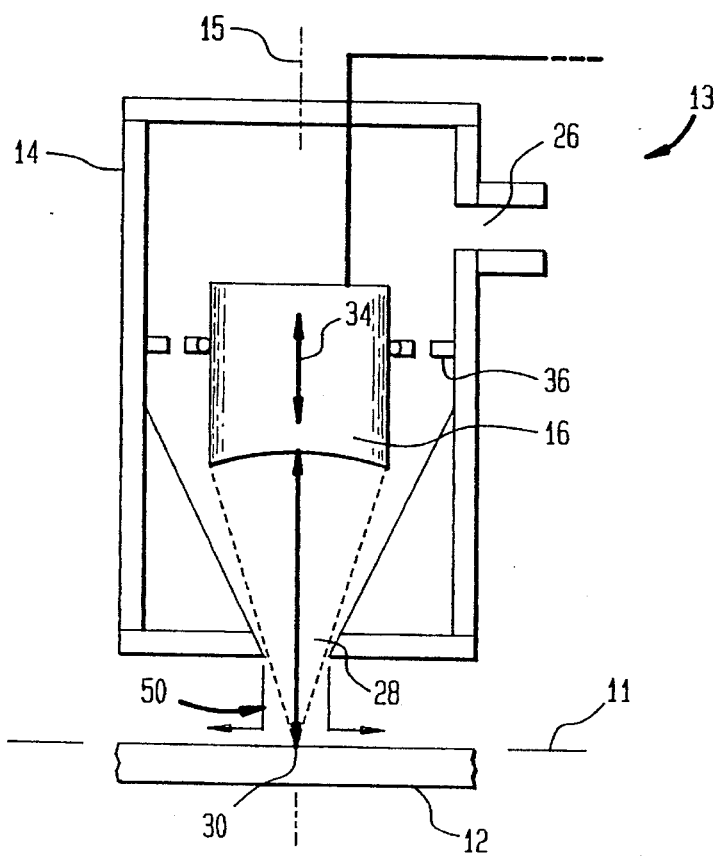
FIG. 4 shows a schematic view with parts in section of an ultrasonic jet cell in a second condition according to the present invention.

A focal point positioning means 18 adjustably positions the focal point 30 of focused ultrasonic wave producing means 16 along the principal axis 15 of housing 14, as indicated by arrow 34, and more particularly, between a first focal point position (as shown in FIG. 3) and a second focal point position (as shown in FIG. 4). That is, the focal point 30 of transducer 16 may be positioned by means 18 at any desired position over the range between the first focal point position and the second focal point position. Preferably, positioning means 18 comprises a suitable means for translating ultrasonic transducer 16 between a first transducer position and a second transducer position along the principal axis of said housing to correspondingly position the focal point of ultrasonic transducer 16 between a first focal point position within housing 14 along the principal axis 15 proximate to the outlet port 28 and a second focal point position beyond housing 14 along the principal axis 15. For instance, positioning means 18 may comprise any suitable positioning means attached to ultrasonic wave producing means 16 and housing 14 for translating transducer 16, such as, a controllable screw mechanism, a hydraulicly controlled linear spacer, a piezoelectric device spacer, or the like.

Referring again to FIG. 3, further included within housing 14 is a means 36 coupled within housing 14 for reducing turbulent flow of the cleaning liquid within the housing 14 to a minimum. Turbulent flow reduction means 36 is positioned within housing 14 to be intermediate portions 22 and 24. The turbulent flow reduction means 36 preferably comprises an aperture plate coupled within housing 14 substantially perpendicular to the principal axis 15 thereof. Aperture plate 36 includes a series of apertures therein, one aperture being a central aperture for receiving the focused ultrasonic wave producing means 16 therebetween. The remainder of apertures are of a suitable size and are arranged around the focused ultrasonic wave producing means 16 to promote laminar flow of the cleaning liquid within portion 24 of housing 14. A suitable means, such as an O-ring gasket, is provided between the aperture plate 36 and transducer 16, to provide a substantially leak-proof seal therebetween while allowing for relative movement between the two parts to occur, as will be explained herein below.

Referring once again to FIGS. 1, 2, and 3, sweeping means 20 is suitably coupled to housing 14 for sweeping housing 14 in a reciprocating manner, as indicated by arrow 39, along a prescribed sweep path 38 over the cleaning plane 11 of wafer 12. Sweeping means 20 maintains housing 14 in a desired orientation, wherein the outlet port 28 is positioned in a direction of the cleaning plane 11 and wherein the principal axis 15 of housing 14 is substantially perpendicular to the cleaning plane 11. Sweeping means 20 further provides an appropriate vertical spacing of housing 14 above cleaning plane 11 (and thus, wafer 12) according to the requirements of a particular cleaning operation (e.g., a spacing distance on the order of 0.05 to 5 centimeters). Sweeping means 20 can comprise, for example, a sweep arm 40 attached to a reciprocating motor 42, the sweep arm 40 being of suitable dimension to provide travel of housing 14 along the desired sweep path 38, and further attached suitably to reciprocating motor 42 to provide a desired vertical spacing of housing 14 above cleaning plane 11, as discussed above. Reciprocating motor 42 is electrically connected to controller 6 for suitable control thereof, that is, for controlling the sweeping of housing 14 in a desired manner, as will be discussed further below.

Figure 5:
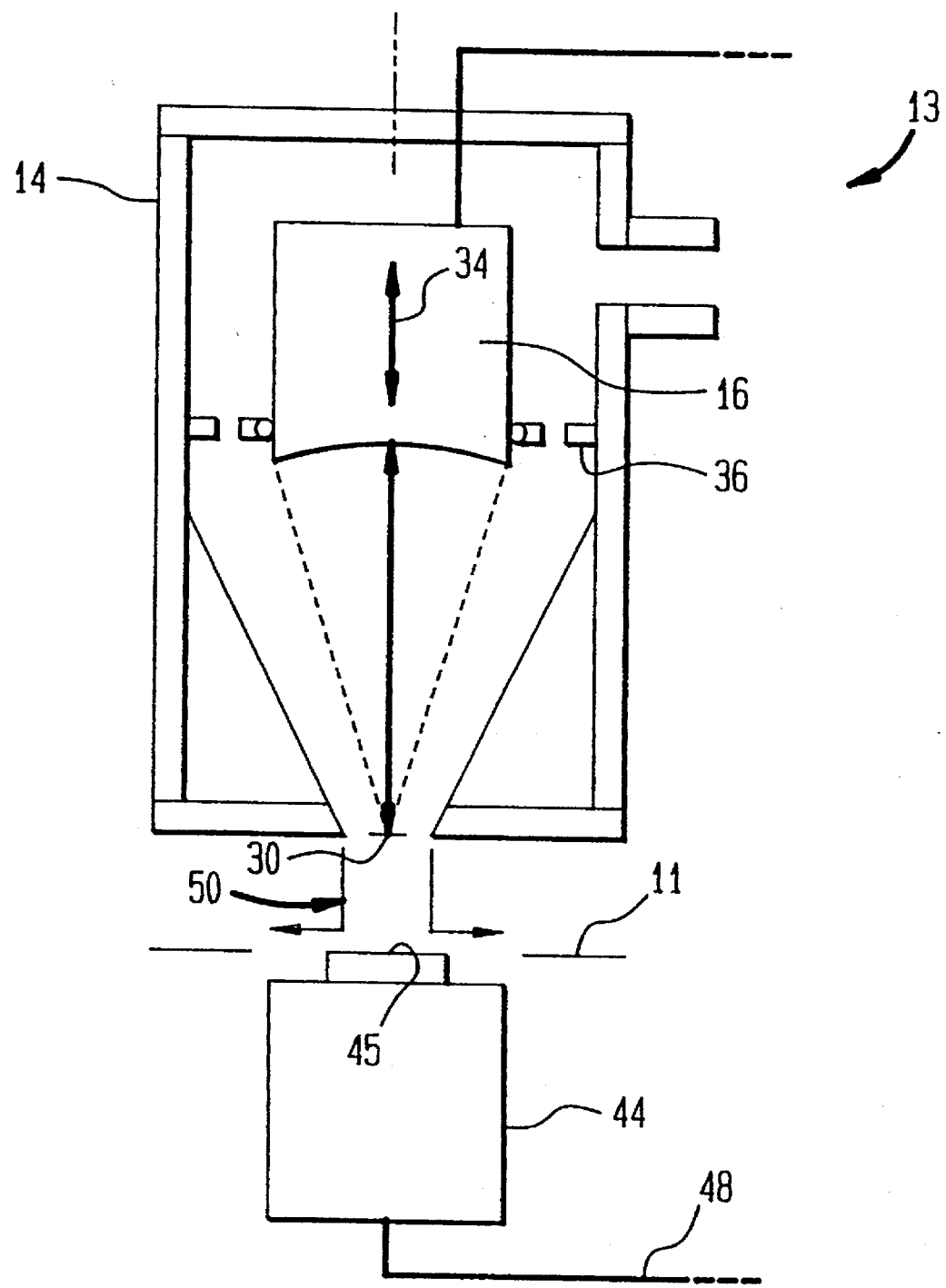
FIG. 5 shows a schematic view with parts in section of an ultrasonic jet cell in a calibration position according to the present invention.

Referring now to FIGS. 1, 2, and 5, a calibration signal means 44 is positioned at a calibration position 46 along the prescribed sweep path 38, the calibration signal means 44 having a top surface thereof located at the cleaning plane 11. Calibration signal means 44 preferably comprises an ultrasonic transducer having a substantially planar detection surface 45. Transducer 44 is for use in a detection mode, that is, for generating a calibration signal representative of an acoustic energy intensity contained in the jet stream at the cleaning plane. An electrical output signal wire 48 of calibration signal means 44 is connected to controller 6. Controller 6 is suitably programmed to be responsive to the calibration signal for controlling focal point positioning means 18 to position the focal point to a desired position, as will be further explained below, whereby the acoustic energy intensity within the jet stream produced by apparatus 10 at the cleaning plane 11 is adjustable to a desired level.

In operation, a wafer 12 having a surface to be cleaned is rotated by motor 5 controlled by controller 6. Controller 6 operates valve 7 to allow cleaning liquid, for example, deionized water, to flow under low pressure into inlet port 26 of housing 14. The water fills both portions 22 and 24 of housing 14. Turbulent flow of the cleaning liquid is minimized as the liquid passes from portion 22 into portion 24 via aperture plate 36. That is, aperture plate 36 encourages laminar flow of the liquid, in the direction of the ultrasonic waves of acoustic energy, to thereby avoid the bouncing of the liquid off the inner wall 25 of portion 24. In other words, undesirable reflections giving rise to turbulence in the liquid are minimized. As a result, with minimum turbulence, the phase of the ultrasonic waves is advantageously maintained and energy from the focused ultrasonic wave producing means 16 in the cleaning liquid is optimized.

Controller 6 energizes RF generator 17 to energize focused ultrasonic wave producing means 16. Upon energization of means 16, focused ultrasonic waves of acoustic energy are produced, focusing to focal point 30. The orientation of means 16 within housing 14 produces a low pressure insonified ultrasonic jet of cleaning liquid released through outlet port 28, the jet having a cross-sectional area substantially equal to the cross-sectional area of outlet port 28. The jet of cleaning liquid 50, or liquid jet stream, provides a column of cleaning liquid to clean the surface of wafer 12, the jet of cleaning liquid also confining the ultrasonic waves of acoustic energy at the cleaning liquid/air interface. This occurs due to the acoustic impedance mismatch at the cleaning liquid/air interface which gives rise to a high acoustic reflection coefficient, preventing acoustic energy from escaping from the liquid out into the air. Furthermore, the acoustic energy propagates in a direction that is co-linear with the jet stream 50. In addition, as the cleaning liquid leaves outlet port 28, acoustic energy confined within jet stream 50 propagates co-linearly within jet stream 50 between the outlet port 28 and the cleaning plane 11 (or wafer 12).

The present invention advantageously achieves excellent cleaning capability with the jet stream 50 of cleaning liquid while avoiding undesirable cavitation of the cleaning liquid. In addition to the previously discussed problems in the art, cavitation in a cleaning liquid may not be desirable when cleaning highly delicate parts. That is, cavitation is the implosion of air within a liquid, resulting in uncontrollable collapsing or break-up of the liquid. Such cavitation, when present in a cleaning liquid during the cleaning of delicate microelectronic parts, or the like, subjects the parts to an undue risk of damage to the same. Cavitation in the cleaning liquid can be further characterized by a non-uniform acoustic energy distribution at the cleaning surface which in turn gives rise to surface erosion and other possible damage.

According to the present invention, means 16 is operated at a high frequency in the range of 0.1 MHz to 100 MHz to advantageously reduce the probability for cavitation of the cleaning liquid to occur. In a preferred embodiment, means 16 is operated at 10 MHz to provide a power density of 5,000 W/cm$^2$ at the focal point 30 and thereby avoid exceeding a cavitation threshold, the cavitation threshold for 10 MHz energization occurring at approximately 100,000 W/cm$^2$, the threshold further being a minimum limit at which cavitation can begin to occur. Thus, the liquid jet 50 produced by jet cell 13 presents no undue hazard to delicate parts being cleaned.

Controller 6 can operatively position the focal point 30 of means 16 between a first focal point position and a second focal point position, according to the requirements of a particular object or wafer being cleaned. Varying the position of focal point 30 effectively adjusts an intensity of acoustic energy at the cleaning plane to achieve various desired cleaning results.

In a first focal point position, as shown in FIG. 3, the jet of cleaning liquid 50 is characterized by longitudinal forces and non-cavitation of the cleaning liquid at the cleaning plane. The focal point 30 is proximate to outlet port 28 wherein, the focused ultrasonic waves of acoustic energy are efficiently transmitted via the cleaning liquid onto the wafer 12, the cleaning liquid effectively functioning as an energy waveguide. The intensity of the acoustic energy at the cleaning surface will be a function of the internal energy reflections within the jet stream. In addition, acoustic energy within jet stream 50 is spread or distributed over an effective area approximately equal to the cross-sectional area of the jet stream prior to contacting wafer 12 or the cleaning plane 11.

In a second focal point position, as shown in FIG. 4, the jet of cleaning liquid 50 is also characterized by longitudinal forces and non-cavitation of the cleaning liquid at the cleaning plane. The focal point 30 is beyond to outlet port 28 wherein, the focused ultrasonic waves of acoustic energy are efficiently transmitted via the cleaning liquid onto the wafer 12. With the focal point 30 located at the wafer 12 in the cleaning plane 11, the cleaning liquid no longer serves to reflect the acoustic energy along its length. Under this condition, the jet stream acts as a medium for transmitting the acoustic energy to the workpiece surface but not for reflecting the energy therein in order to confine it which is typical for a waveguide. The acoustic energy within jet stream 50 is concentrated within a cross-sectional area smaller than the cross-sectional area of the jet stream prior to contacting waver 12 or the cleaning plane 11. For example, the cross-sectional area of concentrated acoustic energy may have a diameter of 150 microns, whereas, the cross-sectional area of the jet stream 50 may have a diameter of 500 microns. The smaller cross-sectional area (i.e., 150 micron diameter) has an acoustic energy density approximately eleven (11) times greater than that of the larger cross-sectional area (i.e., 500 micron diameter). Such a smaller cross-sectional area of acoustic energy presented to the cleaning plane advantageously provides for more localized cleaning without cavitation or the occurrence of any undesirable lateral forces from the jet boundary layer. The intensity of the ultrasonic waves of acoustic energy is thus maximized at the cleaning plane 11, as a result of the focal point 30 being positioned there. Furthermore, the increased energy density at the cleaning plane has a significant effect in making the removal capability of the jet stream 50 considerably more effective.

To calibrate the intensity of acoustic energy at the cleaning plane, controller 6 moves the ultrasonic jet cell 13 to the calibration position 46 along sweep path 38. With the ultrasonic jet cell 13 positioned over calibration means 44, controller 6 controls valve 7 to introduce cleaning liquid into housing 14 and energizes focused ultrasonic wave producing means 16. A jet 50 is produced, enabling the intensity of acoustic energy at the cleaning plane to be determined via calibration means 44. In response to the calibration signal provided by calibration means 44, controller 6 transmits an appropriate signal or signals to focal point position adjusting means 18 and the focal point position of means 16 is adjusted accordingly. Calibration means 44 may also be used for alignment purposes, i.e., for aligning jet cell 13 upon an initial set-up of apparatus 10 and/or during any routine maintenance thereof.

According to the particular requirements of a cleaning operation, a cleaning procedure using the present invention may be as follows. Wafer 12 is placed upon the wafer platen within basin 4 and rotated. Ultrasonic jet cell 13 is placed in the calibration position 46, wherein controller 6 controls appropriate components, as described above, for adjusting the intensity of acoustic energy in the jet stream 50 at the cleaning plane to a first intensity, 5,000 W/cm$^2$ at 10 MHz, for example. A cleaning operation may be conducted solely at this first intensity, wherein controller 6 controls i) the rotation of the wafer 12; ii) the functioning of ultrasonic jet cell 13 to produce the jet stream 50; and iii) the reciprocating motion of jet cell 13 along sweep along path 38 until the entire wafer has been cleaned. Alternatively, other intensities different from the first intensity may be used in a sequence, as necessary, for a particular cleaning operation. As a result of low pressure operation, problems associated with electrostatic discharge are advantageously eliminated. Furthermore, apparatus 10 is operable for relatively low cost, as a result of significantly reduced quantities of expensive DI water at low pressure necessary to perform a cleaning operation, for example.

Figure 6:
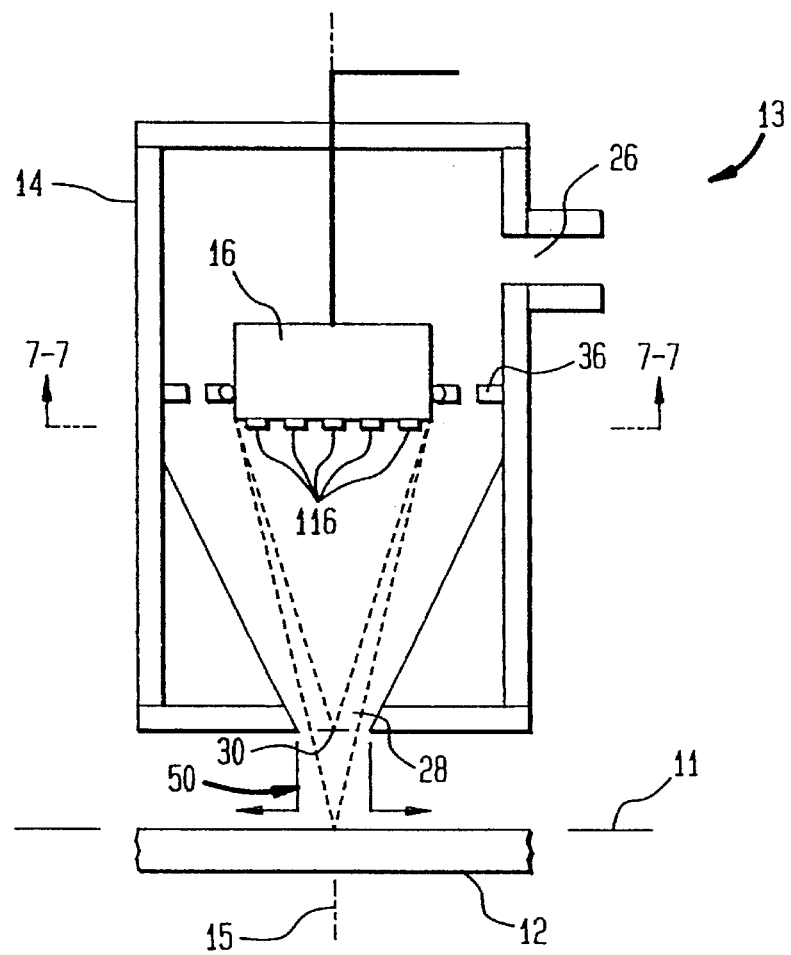
FIG. 6 shows a schematic view with parts in section of an ultrasonic jet cell according to an alternate embodiment of present invention.
Figure 7:
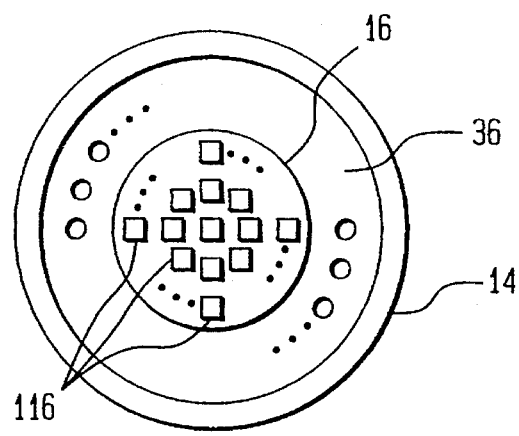
FIG. 7 shows a cross-sectional view of a portion of an ultrasonic jet cell taken along line 7—7 of FIG. 6.

Referring now to FIGS. 6 and 7, in an alternate embodiment, the ultrasonic jet cell 13 is substantially similar to that of the preferred embodiment with the following exceptions. Focused ultrasonic wave producing means 16 comprises an array of flat ultrasonic transducers 116, the array of ultrasonic transducers arranged and phased in a prescribed manner such that a proper time sequence energization of said array produces focused ultrasonic waves of acoustic energy focused to a focal point 30. In lieu of separate RF generating means 18 and positioning means 17, a positioning means for this alternate embodiment can comprise a signal generating means suitable for energizing the array 116 in such a manner for adjustably positioning the focal point 30 of the array of ultrasonic transducers between a first focal point position within housing 14 along the principal axis 15 proximate to the outlet port 28 and a second focal point position beyond the housing 14 along the principal axis. In this latter instance, the second focal point position is preferably at the cleaning plane 11. In operation, the alternate embodiment functions similarly to that of the preferred embodiment.

Figure 8:
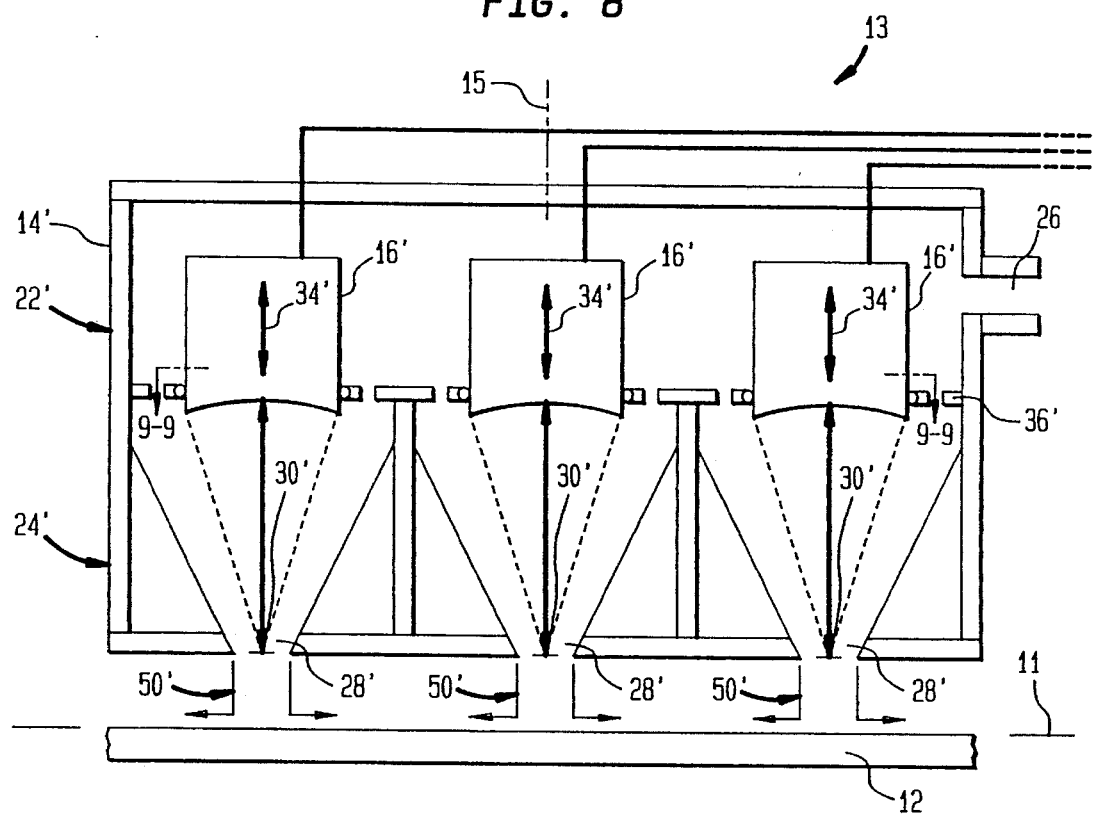
FIG. 8 shows a schematic view with parts in section of an ultrasonic jet cell according to another alternate embodiment of the present invention.
Figure 9:
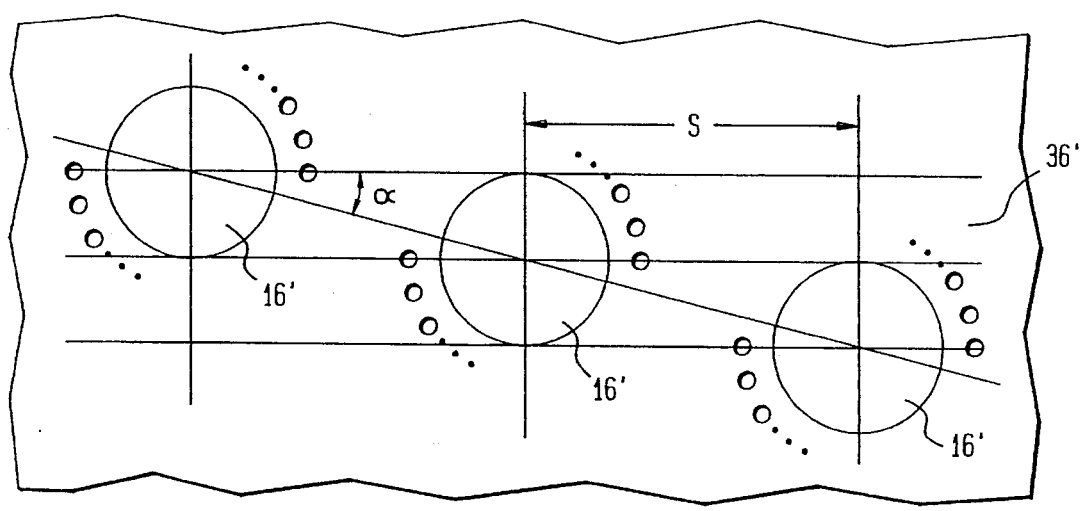
FIG. 9 shows a cross-sectional view of a portion of an ultrasonic jet cell taken along line 9—9 of FIG. 8.

Referring now to FIGS. 8 and 9, in another alternate embodiment of the present invention, the ultrasonic jet cell 13 is substantially similar to that of the preferred embodiment with the following exceptions. Housing 14' includes first and second portions, 22' and 24', respectively. Second portion 24' constitutes a lower portion of housing 14' and includes a plurality of outlet ports 28' for releasing cleaning liquid therethrough. Second portion 24' is characterized by a plurality of inner walls 25', each having a tapered shape in the form of an inverted cone. More particularly, each inner wall 25' is tapered from a first larger diameter dimension down to a dimension substantially matched to the size of the respective outlet port 28'. The conically tapered shape of each inner wall 25' of portion 24' assists in the reduction of turbulent flow of liquid within housing 14' to a minimum. The plurality of outlet ports 28' are concentric about a corresponding plurality of outlet port axes, each of the outlet port axes being parallel to the principal axis 15.

A plurality of means 16' are located within housing 14 along respective axes corresponding to the plurality of outlet port axes. The plurality of means 16' produce ultrasonic waves of acoustic energy focused to a respective focal point 30' wherein acoustic energy density is maximum at the respective focal point. The focused ultrasonic waves of acoustic energy of each focused ultrasonic wave producing means 16' are concentric with and incident a respective outlet port 28' to form a respective jet stream of cleaning liquid 50' released through the respective outlet port, the respective jet stream of cleaning liquid characterized by longitudinal forces and non-cavitation of the cleaning liquid at the cleaning plane 11. An angular orientation α and spacing S between each respective focused ultrasonic wave producing means 16' of the plurality of means 16' is determined by the requirements of a particular cleaning requirement and the type of transducers used. That is, the angular orientation α and spacing S should at least be sufficient to ensure non-interference between adjacent transducers 16'.

A means similar to positioning means 18 of the preferred embodiment may be utilized for positioning each respective focal point of said plurality of focused ultrasonic wave producing means along the respective outlet port axis, indicated by arrow 34', between a first focal point position and a second focal point position.

A means 36' is coupled within housing 14' for reducing turbulent flow of ;the cleaning liquid within housing 14' to a minimum, wherein the turbulent flow reduction means 36' comprises an aperture plate coupled within housing 14' intermediate portions 22' and 24', and further substantially perpendicular to the principal axis 15. The aperture plate comprises a corresponding plurality of apertures for receiving the plurality of focused ultrasonic wave producing means 16' therethrough and a series of apertures arranged around said plurality of focused ultrasonic wave producing means. Suitable means, such as O-rings, are provided between the aperture plate 36' and transducers 16' to provide substantially leak-proof seals therebetween while allowing for relative movement between the parts to occur.

In the second alternate embodiment, a calibration means similar to calibration means 44 can be located in the cleaning plane and positioned at a calibration position 46 along a prescribed sweep path 38 for providing a calibration signal of an acoustic energy intensity contained in a desired jet stream, of the plurality of jet steams, at the cleaning plane. Controller 6 can be made responsive to the calibration signal for controlling the focal point positioning means to position a respective focal point corresponding to the desired jet steam to a desired position, whereby acoustic energy intensity of the desired jet steam at the cleaning plane is adjusted to a desired level. In operation, the second alternate embodiment functions similarly to that of the preferred embodiment.

There has thus been shown a cleaning apparatus for cleaning semiconductor wafers or microelectronic parts providing an optimal low pressure liquid jet capable of highly efficient energy transfer from an ultrasonic transducer for enhanced cleaning efficiency. The present invention is well suited for providing a desired cleaning performance as necessary for the particular requirements of the part being cleaned. Still further, the present invention is well suited for use in a high volume manufacturing environment. The present invention thus provides a spin-clean apparatus which overcomes the previously-mentioned problems and disadvantages.

While the invention has been particularly shown and described with reference to the preferred embodiment thereof, it will be understood by those skilled in the art that various changes in form and detail may be made therein without departing from the spirit and scope of the invention. For example, the present invention may likewise be suitable for cleaning of other objects, such as, the cleaning of magnetic disks, for example.

What is claimed is:

1. A method for removing debris from a surface of a semiconductor wafer as the wafer is rotated about a prescribed axis in a cleaning plane, said method comprising the steps of:

a) providing a housing having a principal axis, an inlet port for receiving a cleaning liquid from a supply, and an outlet port concentric about the principal axis for releasing the cleaning liquid therethrough;

b) producing within said housing ultrasonic waves of acoustic energy focused to a focal point wherein acoustic energy density is maximum at the focal point, the focused ultrasonic waves of acoustic energy being concentric with and incident the outlet port to form a jet stream of the cleaning liquid released through the outlet port, the jet stream of the cleaning liquid being characterized by longitudinal forces and non-cavitation of the cleaning liquid;

c) adjustably positioning the focal point of said focused ultrasonic waves along the principal axis of said housing, thereby positioning the focal point between a first focal point position and a second focal point position; and d) moving said housing in a reciprocating manner along a prescribed sweep path over the cleaning plane thereby removing said debris from said surface, wherein the outlet port is positioned in a direction of the cleaning plane and the principal axis is substantially perpendicular to the cleaning plane; wherein:

producing focused ultrasonic waves comprises providing an ultrasonic transducer having a concave surface, the concave surface being oriented within said housing towards the outlet port; and, adjustably positioning the focal point comprises providing a means for translating said ultrasonic transducer between a first transducer position and a second transducer position along the principal axis of said housing to correspondingly position the focal point of said ultrasonic transducer between a first focal point position within said housing along the principal axis proximate to the outlet port and a second focal point position beyond said housing along the principal axis.

2. The method of claim 1, further comprising the step of:

e) promoting a laminar flow of the cleaning liquid within said housing.

3. The method of claim 2, wherein:

said step of promoting a laminar flow of the cleaning liquid within said housing comprises providing an aperture plate coupled within said housing substantially perpendicular to the principal axis thereof, said aperture plate having a series of apertures therein arranged around said ultrasonic transducer.

4. The method of claim 1, further comprising the steps of:

e) providing a calibration signal of an acoustic energy intensity contained in the jet stream at the cleaning plane; and f) positioning the focal point to a desired position in response to the calibration signal, whereby the acoustic energy intensity within the jet stream at the cleaning plane is adjusted to a desired level.

5. A method for removing debris from a surface of a semiconductor wafer as the wafer is rotated about a prescribed axis in a cleaning plane, said method comprising the steps of:

a) providing a housing having a principal axis, an inlet port for receiving a cleaning liquid from a supply, and an outlet port concentric about the principal axis for releasing the cleaning liquid therethrough;

b) producing within said housing ultrasonic waves of acoustic energy focused to a focal point wherein acoustic energy density is maximum at the focal point, the focused ultrasonic waves of acoustic energy being concentric with and incident the outlet port to form a jet stream of the cleaning liquid released through the outlet port, the jet stream of the cleaning liquid being characterized by longitudinal forces and non-cavitation of the cleaning liquid;

c) adjustably positioning the focal point of said focused ultrasonic waves along the principal axis of said housing, thereby positioning the focal point between a first focal point position and a second focal point position; and d) moving said housing in a reciprocating manner along a prescribed sweep path over the cleaning plane thereby removing said debris from said surface, wherein the outlet port is positioned in a direction of the cleaning plane and the principal axis is substantially perpendicular to the cleaning plane; wherein:

producing focused ultrasonic waves comprises providing an array of ultrasonic transducers, said array of ultrasonic transducers arranged and phased in a prescribed manner such that a proper time sequence energization of said array produces focused ultrasonic waves of acoustic energy; and adjustably positioning the focal point comprises providing a signal generating means for energizing said array for adjustably positioning the focal point of said array of ultrasonic transducers between a first focal point position within said housing along the principal axis proximate to the outlet port and a second focal point position beyond said housing along the principal axis.

6. The method of claim 5, further comprising the step of:

e) promoting a laminar flow of the cleaning liquid within said housing.

7. The method of claim 6, wherein:

said step of promoting a laminar flow of the cleaning liquid within said housing comprises providing an aperture plate coupled within said housing substantially perpendicular to the principal axis thereof, said aperture plate having a series of apertures therein arranged around said array of ultrasonic transducers.

8. The method of claim 5, further comprising the steps of:

e) providing a calibration signal of an acoustic energy intensity contained in the jet stream at the cleaning plane; and f) positioning the focal point to a desired position in response to the calibration signal, whereby the acoustic energy intensity within the jet stream at the cleaning plane is adjusted to a desired level.

9. A method for removing debris from a surface of an object to be cleaned, said method comprising the steps of:

a) providing a housing having a principal axis, an inlet port for receiving a cleaning liquid from a supply, and an outlet port concentric about the principal axis for releasing the cleaning liquid therethrough;

b) producing within said housing focused ultrasonic waves of acoustic energy focused to a focal point wherein acoustic energy density is maximum at the focal point, the focused ultrasonic waves of acoustic energy being concentric with and incident the outlet port to form a jet stream of the cleaning liquid released through the outlet port, the jet stream of the cleaning liquid being characterized by longitudinal forces and non-cavitation of the cleaning liquid;

c) adjustably positioning the focal point of said focused ultrasonic waves along the principal axis of said housing, thereby positioning the focal point between a first focal point position and a second focal point position; and d) positioning the outlet port of said housing in a direction of the object to be cleaned, thereby removing said debris from said surface; wherein:

producing focused ultrasonic waves comprises providing an ultrasonic transducer having a concave surface, the concave surface being oriented within said housing towards the outlet port; and, adjustably positioning the focal point comprises providing a means for translating said ultrasonic transducer between a first transducer position and a second transducer position along the principal axis of said housing to correspondingly position the focal point of said ultrasonic transducer between a first focal point position within said housing along the principal axis proximate to the outlet port and a second focal point position beyond said housing along the principal axis.

10. The method of claim 9, further comprising the step of:

e) promoting a laminar flow of the cleaning liquid within said housing.

11. The method of claim 10, wherein:

said step of promoting a laminar flow of the cleaning liquid within said housing comprises providing an aperture plate coupled within said housing substantially perpendicular to the principal axis thereof, said aperture plate having a series of apertures therein arranged around said ultrasonic transducer.

12. A method for removing debris from a surface of an object to be cleaned, said method comprising the steps of:

a) providing a housing having a principal axis, an inlet port for receiving a cleaning liquid from a supply, and an outlet port concentric about the principal axis for releasing the cleaning liquid therethrough;

b) producing within said housing focused ultrasonic waves of acoustic energy focused to a focal point wherein acoustic energy density is maximum at the focal point, the focused ultrasonic waves of acoustic energy being concentric with and incident the outlet port to form a jet stream of the cleaning liquid released through the outlet port, the jet stream of the cleaning liquid being characterized by longitudinal forces and non-cavitation of the cleaning liquid;

c) adjustably positioning the focal point of said focused ultrasonic waves along the principal axis of said housing, thereby positioning the focal point between a first focal point position and a second focal point position; and d) positioning the outlet port of said housing in a direction of the object to be cleaned, thereby removing said debris from said surface; wherein:

producing focused ultrasonic waves comprises providing an array of ultrasonic transducers, said array of ultrasonic transducers arranged and phased in a prescribed manner such that said array may be energized in a proper time sequence to produce focused ultrasonic waves of acoustic energy; and adjustably positioning the focal point comprises providing a signal generating means for energizing said array for adjustably positioning the focal point of said array of ultrasonic transducers between a first focal point position within said housing along the principal axis proximate to the outlet port and a second focal point position beyond said housing along the principal axis.

13. The method of claim 12, further comprising the step of:

e) promoting a laminar flow of the cleaning liquid within said housing.

14. The method of claim 13, wherein:

said step of promoting a laminar flow of the cleaning liquid within said housing comprises providing an aperture plate coupled within said housing substantially perpendicular to the principal axis thereof, said aperture plate having a series of apertures therein arranged around said array of ultrasonic transducers.

* * * * *